US006930930B2

(12) United States Patent
Terletzki et al.

(10) Patent No.: US 6,930,930 B2
(45) Date of Patent: Aug. 16, 2005

(54) USING ISOLATED P-WELL TRANSISTOR ARRANGEMENTS TO AVOID LEAKAGE CAUSED BY WORD LINE/BIT LINE SHORTS

(75) Inventors: Hartmud Terletzki, Poughkeepsie, NY (US); Manfred Menke, Wolfratshausen (DE)

(73) Assignee: Infineon Technologies AG, Munich (DE)

( * ) Notice: Subject to any disclaimer, the term of this patent is extended or adjusted under 35 U.S.C. 154(b) by 42 days.

(21) Appl. No.: 10/289,075

(22) Filed: Nov. 6, 2002

(65) Prior Publication Data

US 2004/0084703 A1 May 6, 2004

(51) Int. Cl.[7] ............................................. G11C 16/04
(52) U.S. Cl. ........................ 365/189.06; 365/189.09; 365/226
(58) Field of Search ................... 365/189.06, 189.09, 365/226

(56) References Cited

U.S. PATENT DOCUMENTS

| 5,499,211 | A | | 3/1996 | Kirihata et al. |
| 5,519,243 | A | | 5/1996 | Kikuda et al. ............... 257/371 |
| 5,650,975 | A | | 7/1997 | Hamade et al. ........ 365/230.01 |
| 5,905,679 | A | * | 5/1999 | Tsukikawa ............. 365/189.06 |
| 6,002,162 | A | | 12/1999 | Takahashi et al. .......... 257/544 |
| 6,046,948 | A | * | 4/2000 | Zheng et al. ................ 365/203 |
| 6,141,259 | A | * | 10/2000 | Scott et al. ............ 365/189.06 |
| 6,144,599 | A | | 11/2000 | Akita et al. |
| 6,228,704 | B1 | | 5/2001 | Uchida ........................ 438/241 |
| 6,252,806 | B1 | | 6/2001 | Ellis et al. ............. 365/189.09 |

FOREIGN PATENT DOCUMENTS

| DE | 4300826 A1 | 1/1994 |
| GB | 2269049 A | 1/1994 |

OTHER PUBLICATIONS

Shochi: "Semiconductor Storage Device and its Manufacture", Patent Abstracts of Japan, Oct. 15, 1999, No. 11284146 (1 page).
Shigenobu: "Semiconductor Memory", Patent Abstracts of Japan, Jan. 22, 1999, No. 11017134 (1 page).
Yamagata, T., et al., "Low Voltage Circuit Design Techniques for Battery–Operated and/or Giga–Scale Dram's," IEEE Journal of Solid–State Circuits, vol. 30, No. 11, Nov. 1995, pp. 1183–1188, New York, US.

* cited by examiner

Primary Examiner—Van Thu Nguyen
Assistant Examiner—Pho M. Luu
(74) Attorney, Agent, or Firm—Slater & Matsil, L.L.P.

(57) ABSTRACT

Leakage in semiconductors, such as dynamic random access memory (DRAM) devices, caused by word line/bit line shorts can be avoided by locating transistors (e.g., isolator, current limiter, equalize) inside isolated p-wells.

48 Claims, 9 Drawing Sheets

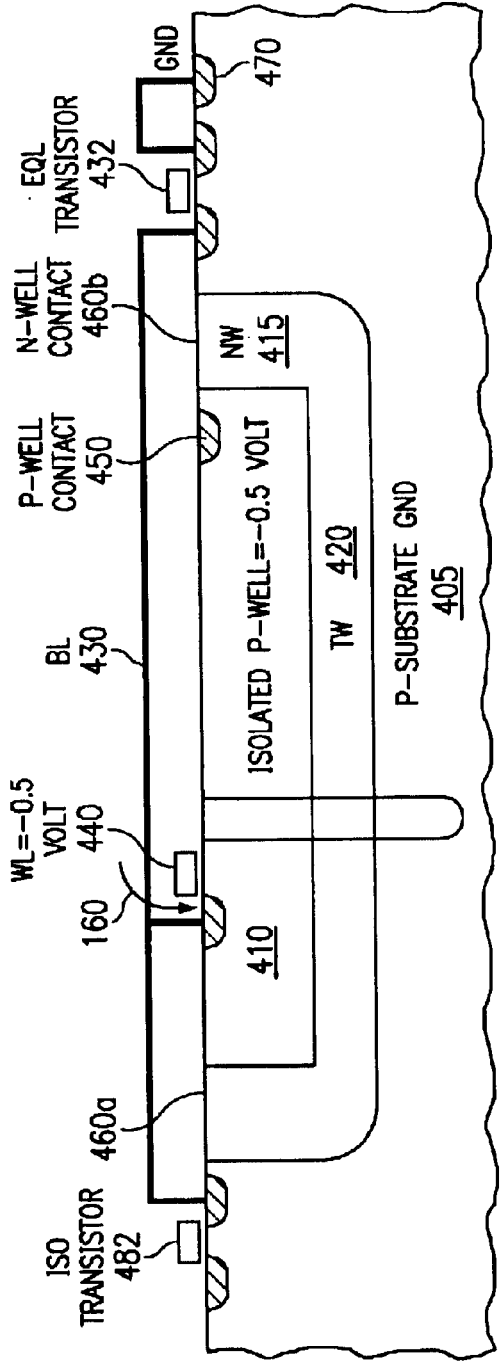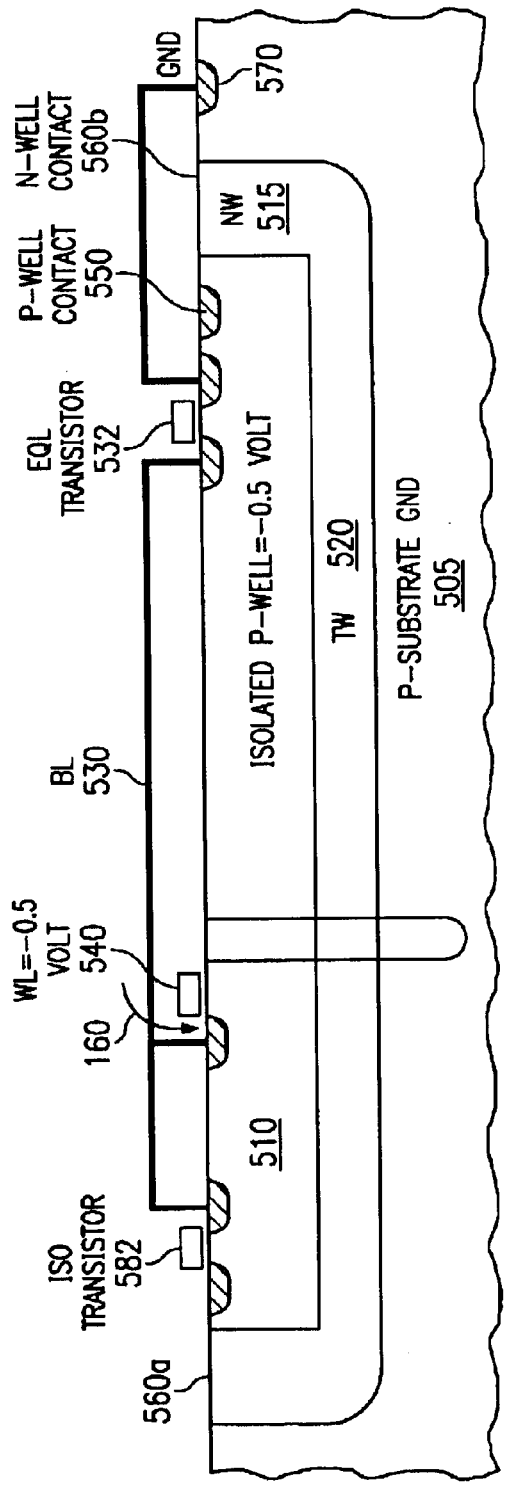

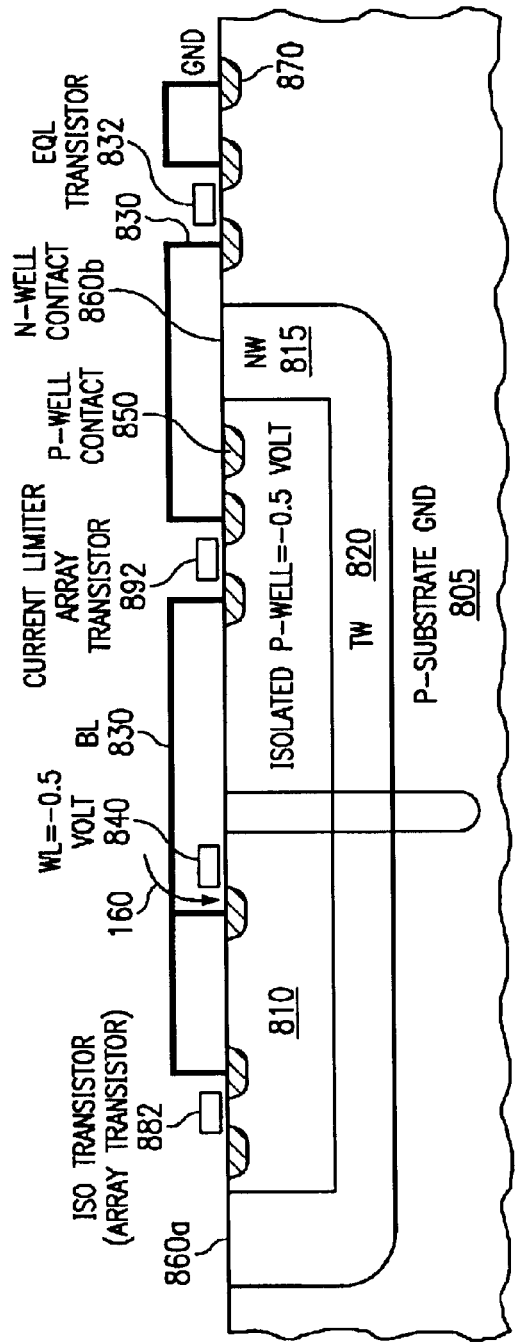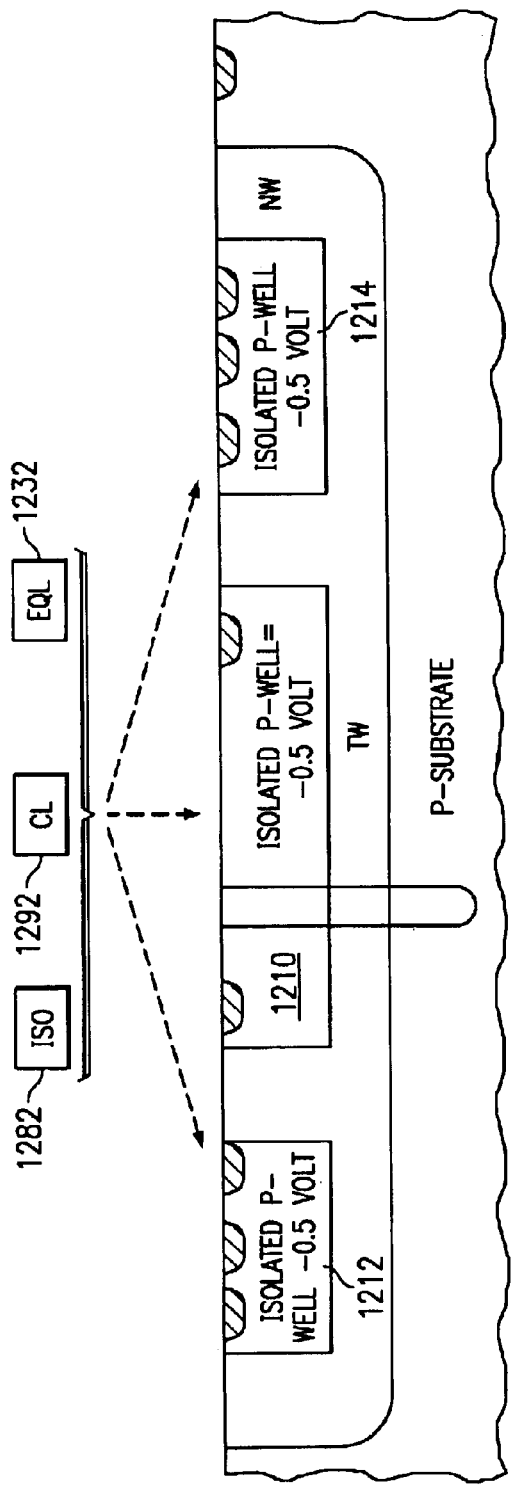

*FIG. 13*

| | ISOLATOR TRANSISTOR (ISO) | CURRENT LIMITER TRANSISTOR (CL) | EQUALIZE TRANSISTOR (EQL) | |
|---|---|---|---|---|
| | NOT IN A P-WELL | Not Used | NOT IN A P-WELL | PRIOR ART |
| 1 | NOT IN A P-WELL | Not Used | IN ARRAY P-WELL | |
| 2 | NOT IN A P-WELL | Not Used | IN SEPARATE P-WELL | |
| 3 | IN ARRAY P-WELL | Not Used | NOT IN A P-WELL | |
| 4 | IN ARRAY P-WELL | Not Used | IN ARRAY P-WELL | |
| 5 | IN ARRAY P-WELL | Not Used | IN SEPARATE P-WELL | |
| 6 | IN SEPARATE P-WELL | Not Used | NOT IN A P-WELL | |
| 7 | IN SEPARATE P-WELL | Not Used | IN ARRAY P-WELL | |
| 8 | IN SEPARATE P-WELL | Not Used | IN SEPARATE P-WELL | |
| 9 | IN SEPARATE P-WELL | Not Used | IN SEPARATE P-WELL W/ISO | |
| | NOT IN A P-WELL | NOT IN A P-WELL | NOT IN A P-WELL | PRIOR ART |
| 10 | NOT IN A P-WELL | NOT IN A P-WELL | IN ARRAY P-WELL | |
| 11 | NOT IN A P-WELL | NOT IN A P-WELL | IN SEPARATE P-WELL | |
| 12 | NOT IN A P-WELL | IN ARRAY P-WELL | NOT IN A P-WELL | |
| 13 | NOT IN A P-WELL | IN ARRAY P-WELL | IN ARRAY P-WELL | |
| 14 | NOT IN A P-WELL | IN ARRAY P-WELL | IN SEPARATE P-WELL | |
| 15 | NOT IN A P-WELL | IN SEPARATE P-WELL | NOT IN A P-WELL | |
| 16 | NOT IN A P-WELL | IN SEPARATE P-WELL | IN ARRAY P-WELL | |
| 17 | NOT IN A P-WELL | IN SEPARATE P-WELL | IN SEPARATE P-WELL | |
| 18 | NOT IN A P-WELL | IN SEPARATE P-WELL | IN SEPARATE P-WELL W/CL | |
| 19 | IN ARRAY P-WELL | NOT IN A P-WELL | NOT IN A P-WELL | |
| 20 | IN ARRAY P-WELL | NOT IN A P-WELL | IN ARRAY P-WELL | |
| 21 | IN ARRAY P-WELL | NOT IN A P-WELL | IN SEPARATE P-WELL | |
| 22 | IN ARRAY P-WELL | IN ARRAY P-WELL | NOT IN A P-WELL | |
| 23 | IN ARRAY P-WELL | IN ARRAY P-WELL | IN ARRAY P-WELL | |
| 24 | IN ARRAY P-WELL | IN ARRAY P-WELL | IN SEPARATE P-WELL | |
| 25 | IN ARRAY P-WELL | IN SEPARATE P-WELL | NOT IN A P-WELL | |
| 26 | IN ARRAY P-WELL | IN SEPARATE P-WELL | IN ARRAY P-WELL | |
| 27 | IN ARRAY P-WELL | IN SEPARATE P-WELL | IN SEPARATE P-WELL | |
| 28 | IN ARRAY P-WELL | IN SEPARATE P-WELL | IN SEPARATE P-WELL W/CL | |
| 29 | IN SEPARATE P-WELL | NOT IN A P-WELL | NOT IN A P-WELL | |
| 30 | IN SEPARATE P-WELL | NOT IN A P-WELL | IN ARRAY P-WELL | |
| 31 | IN SEPARATE P-WELL | NOT IN A P-WELL | IN SEPARATE P-WELL | |
| 32 | IN SEPARATE P-WELL | NOT IN A P-WELL | IN SEPARATE P-WELL W/ISO | |
| 33 | IN SEPARATE P-WELL | IN ARRAY P-WELL | NOT IN A P-WELL | |
| 34 | IN SEPARATE P-WELL | IN ARRAY P-WELL | IN ARRAY P-WELL | |
| 35 | IN SEPARATE P-WELL | IN ARRAY P-WELL | IN SEPARATE P-WELL | |
| 36 | IN SEPARATE P-WELL | IN ARRAY P-WELL | IN SEPARATE P-WELL W/ISO | |
| 37 | IN SEPARATE P-WELL | IN SEPARATE P-WELL | NOT IN A P-WELL | |
| 38 | IN SEPARATE P-WELL | IN SEPARATE P-WELL | IN ARRAY P-WELL | |
| 39 | IN SEPARATE P-WELL | IN SEPARATE P-WELL | IN SEPARATE P-WELL | |
| 40 | IN SEPARATE P-WELL | IN SEPARATE P-WELL | IN SEPARATE P-WELL W/CL | |
| 41 | IN SEPARATE P-WELL | IN SEPARATE P-WELL W/ISO | NOT IN A P-WELL | |
| 42 | IN SEPARATE P-WELL | IN SEPARATE P-WELL W/ISO | IN ARRAY P-WELL | |
| 43 | IN SEPARATE P-WELL | IN SEPARATE P-WELL W/ISO | IN SEPARATE P-WELL | |
| 44 | IN SEPARATE P-WELL | IN SEPARATE P-WELL W/ISO | IN SEPARATE P-WELL W/ISO | |

…

USING ISOLATED P-WELL TRANSISTOR ARRANGEMENTS TO AVOID LEAKAGE CAUSED BY WORD LINE/BIT LINE SHORTS

FIELD OF THE INVENTION

The invention relates generally to semiconductor memory integrated circuits (ICs), such as dynamic random access memories (DRAMs), and, more particularly, to avoiding leakage caused by word line/bit line shorts.

BACKGROUND OF THE INVENTION

Dynamic random access memories (DRAM) are the most commonly manufactured product of all semiconductor integrated circuits (ICs). DRAMs are data storage devices that store data as a charge on a storage capacitor. A DRAM typically includes an array of memory cells. Each memory cell includes a storage capacitor and a transistor for transferring charge to and from the storage capacitor. Each memory cell is addressed by a word line (WL) and accessed by a bit line (BL) pair. The WL controls the transistor such that the transistor couples the storage capacitor to and decouples the storage capacitor from the BL pair for writing data to and reading data from the memory cell. Multiple word lines correspond to multiple rows of memory cells, while multiple bit line pairs correspond to multiple columns of memory cells.

Word line/bit line (WL/BL) shorts are the most common failure mode in DRAMs, especially when self-aligned BL contacts are used. These shorts create a leakage path from the output of the WL driver via the equalize (EQL) transistor to the equalize voltage, causing a constant current flow and charging the generator system. More specifically, during standby mode, paired BLs are kept at a preset bit line precharged potential. Generally, the precharge potential is set to half the high level potential of the BL. At this time, the potential of the WL is set at a low level. Therefore, when a WL/BL short occurs, a leakage current will continuously flow from the BL which is set at the preset precharge potential to the WL which is set at a low level potential, such as ground. As a result, the potential of the BL which is short-circuited to the WL is lowered. The amount of lowering in the BL potential depends on a resistance between the short-circuited BL and WL and the conductance of a precharge current limiting element, if any, connected to the BL. The output voltage of the WL driver is either high or low, depending on operational conditions. The equalize voltage is high, ground (GND), or mid-level, depending on the sensing scheme. Used in this context, "low" indicates zero (GND), slightly above zero, or below zero (e.g., $V_{WLL}=-0.5$ volts). In any case, there is at least one operational condition where a leakage current causes additional load to the on-chip generator system. This additional load leads to reduced voltage levels and can cause a portion or all of the DRAM to malfunction.

FIG. 1 diagrammatically illustrates a word line/bit line (WL/BL) short 160 in array word line transistor arrangement 100 with grounded equalize 132, 137 and sense amplifier 150 as known in the art. Transistor 125 and capacitor 127 form array cell 120. The source of transistor 125 is connected to capacitor 127. Capacitor 127 is then connected to plate 129, which is preferably held at half the high level potential of BLt 130. The gate of transistor 125 is connected to word line (WL) 140 of the row in which cell 120 is located. The drain of transistor 125 is connected to a bit line (BL), BLt 130, of the column in which cell 120 is located. BLt 130 includes BLt EQL transistor 132, connected to ground 170. A complementary BL, BLc 135, is also provided for the column in which cell 120 is located. BLc 135 includes BLc EQL transistor 137, connected to ground 170. Conventionally, EQL 132 and 135 are regular N-Channel Junction Field-Effect Transistors ("NFETs"). BLt 130 and BLc 135 comprise a BL pair. EQL 132, 137 charges BLt 130 and BLc 135 to the EQL voltage. A value read out of cell 120 onto BLt 130 is amplified by sense amplifier 150. SAEQ 152 is used to shorten BLt 130 and BLc 135. WL/BL short 160 has a current path from the output 115 of WL driver 110, which is tied to $V_{WLL}$ 108 via NFET transistor 106, through WL/BL short 160 across BLt EQL transistor 132 to ground 170.

FIG. 2 diagrammatically illustrates a word line/bit line (WL/BL) short 160 in an array word line transistor arrangement 200 with grounded equalize 132, 137 and shared sense amplifier 250 as known in the art. In the conventional embodiment of FIG. 2, a current path parallel to the path described with reference to FIG. 1 is formed across BLt isolator (ISO) transistor 282, SAEQ transistor 252, BLc ISO transistor 287 and BLc EQL transistor 137 to ground 170. Conventionally, ISO 282 and 287 are thick oxide NFETs. $V_{WLL}$ 108 is a small negative voltage (e.g., −0.5 volts), but can still cause a leakage current of up to 110 μA per WL/BL short 160 while operating in precharge mode. A special problem occurs when a shared sense amplifier, such as shared sense amplifier 250, is used; not only does WL/BL short 160 adversely affect BLt 130, but the operation margin of BLc 135 is reduced. However, since the amount of the reduction is small in comparison with BLt 130, it becomes extremely difficult to detect BLc 135 through the conventional screening process. As a result, a semiconductor memory device containing a WL/BL short, such as WL/BL short 160, can be subjected to post processing without a replacement of the shorted BL, such as BLt 130. The defect may not be detected until after the semiconductor memory device has been assembled into a package. It may even ship as product before being detected.

FIGS. 3 and 4 diagrammatically illustrate different views of FIG. 2. FIG. 3 diagrammatically illustrates shared sense amplifier arrangement 300 with equalize transistors, EQL Top 332a–n, 337a–n and EQL Bottom 334a–n, 339a–n, and isolator transistors, ISO Top 382a–n, 387a–n and ISO Bottom 384a–n, 389a–n, as known in the art. BL pairs 330a–n, 335a–n and 333a–n, 336a–n provide access to all cells in the arrays, while WLs 340a–m address array rows a–m, respectively. ISO Top 382a–n, 387a–n are in BL pairs 330a–n, 335a–n, respectively, between array 31 and shared sense amplifier 350. ISO Bottom 384a–n, 389a–n are in BL pairs 333a–n, 336a–n, respectively, between shared sense amplifier 350 and array 32. EQL Top 332a–n, 337a–n, in BL pairs 330a–n, 335a–n, respectively, are connected to ground. EQL Bottom 334a–n, 339a–n, in BL pairs 333a–n, 336a–n, respectively, are connected to ground.

FIG. 4 diagrammatically illustrates a leakage path to ground 470 via equalize (EQL) 432 and isolator (ISO) 482 transistor diffusion as known in the art. The cross-sectional view of FIGS. 2 and 3 shown in FIG. 4 includes WL/BL short 160 at the intersection of WL 440 and BL 430 between ISO 482 and EQL 432, with a leakage path to ground 470. In addition to the transistor current, a forward biased diode current from both EQL 432 and ISO 482 transistor diffusion contributes to the overall leakage current. Therefore, even if EQL 432 and ISO 482 transistors are turned off (e.g., gate at $V_{WLL}$), in some operational states the forward biased diode current can still cause a leakage path to ground 470. Isolated p-well 410 is created by placing a p-well inside n-well (NW) 415, resulting in a third type of well structure: triple well (TW) 420. TW 420 uses the reverse bias between NW 415 and p-substrate 405 to electrically isolate individual DRAM and logic circuit sections to minimize mutual interference. TW 420 enables independent optimization of all device types on a chip (e.g., logic, SRAM or DRAM), as well as improved isolation from substrate noise. In the conventional embodiment of FIG. 4, ISO 482 and EQL 432 are connected via BL 430 and are located at opposite ends of and external to TW 420. P-well contact 450 is within isolated p-well 410, while n-well contacts 460a and 460b are at opposite ends of NW 415, near ISO 482 and EQL 432, respectively.

Known concepts for reducing leakage caused by WL/BL shorts, such as WL/BL short 160 shown in FIGS. 1, 2 and 4, include placing current limiter transistors between the array transistor, such as transistor 125, and the EQL transistors, such as EQL 132, 137. The current limiter transistor is designed with three (3) or four (4) times the nominal gate length and is tied to an internal voltage (e.g., $V_{INT}$) which is the nominal operational voltage. Prior art designs intentionally utilize the current limiter transistor to limit the current, but not to completely avoid the leakage. FIG. 9 diagrammatically illustrates a word line/bit line short 160 with current limiter transistors 910 and 920 in an equalize path as known in the art. The primary difference between the conventional embodiment of FIG. 1 and the conventional embodiment of FIG. 9 is the addition of current limiter transistors (VCULI) 910 and 920 connected to EQL 132, 137, respectively, opposite ground 170, in BLt 130 and BLc 135, respectively.

It is therefore desirable to provide a solution that avoids leakage caused by word line/bit line shorts. The present invention attempts to avoid such leakage by providing one or more of the transistors (e.g., isolator, current limiter and equalize) inside an isolated p-well.

BRIEF DESCRIPTION OF THE DRAWINGS

The above and further advantages of the invention may be better understood by referring to the following description in conjunction with the accompanying drawings in which corresponding numerals in the different figures refer to the corresponding parts, in which:

FIG. 4 diagrammatically illustrates a leakage path to ground via equalize and isolator transistor diffusion as known in the art;

FIG. 5 diagrammatically illustrates an equalize and isolator transistor diffusion inside an isolated p-well in accordance with an exemplary embodiment of the present invention;

FIG. 8 diagrammatically illustrates an array-type current limiter transistor in an equalize path inside an isolated p-well in accordance with an exemplary embodiment of the present invention;

FIG. 12 diagrammatically illustrates exemplary embodiments of a layout and transistors in accordance with the present invention; and FIG. 13 illustrates a table of exemplary transistor configurations in accordance with the present invention.

DETAILED DESCRIPTION

Figure 1:
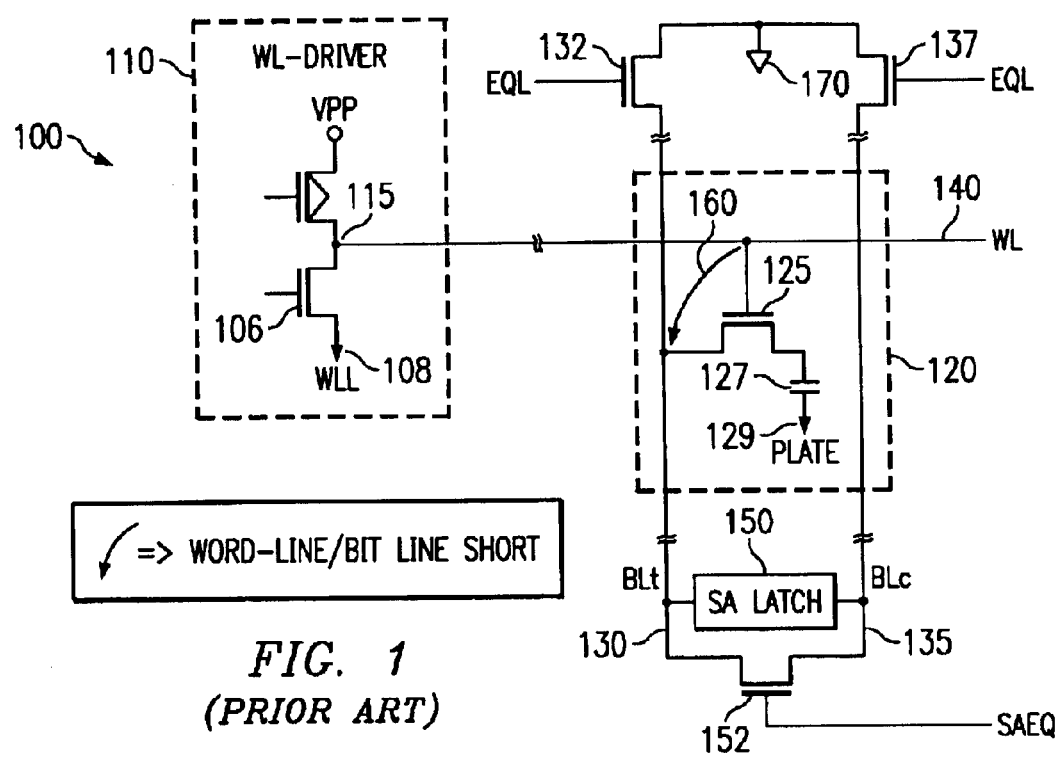
FIG. 1 diagrammatically illustrates a word line/bit line short in an array word line transistor with grounded equalize and sense amplifier as known in the art.

While the making and using of various embodiments of the present invention are discussed herein in terms of specific sensing schemes and voltage conditions, it should be appreciated that the present invention provides many inventive concepts that can be embodied in a wide variety of contexts. The specific embodiments discussed herein are merely illustrative of specific ways to make and use the invention, and are not meant to limit the scope of the invention.

The present invention provides avoids leakage caused by word line/bit line (WL/BL) shorts in dynamic random access memory devices ("DRAMs"). The present invention provides a semiconductor with transistors, such as isolator ("ISO"), current limiter, and equalize ("EQL"), located inside one or more isolated p-wells, with the one or more p-wells biased to a predetermined voltage, such as −0.5 volts. The negative voltage enables the array transistor to increase the threshold voltage ("$V_{th}$") and provide good sub-threshold behavior (the "back-bias" effect). A higher $V_{th}$ reduces the "off" current which is good for retention time and the good sub-threshold provides adequate driveability, both of which are desirable in DRAM design. For illustrative purposes, a grounded sensing scheme with negative word line low voltage ($V_{WLL}$) is assumed. Used in this context, "low" indicates zero (GND), slightly above zero, or below zero (e.g., $V_{WLL}$=−0.5 volts).

In some embodiments of the present invention (e.g., FIGS. 5 and 6), the isolator transistor can be a thick oxide N-Channel Junction Field-Effect Transistor ("NFET"). In other embodiments of the present invention (e.g., FIGS. 7 and 8), the isolator transistor can be an array type transistor. Additionally, in some embodiments of the present invention (e.g., FIGS. 5 and 6), the equalize transistor can be a regular NFET, while in other embodiments (e.g., FIG. 7) it can be an array type transistor. Further, some embodiments of the present invention (e.g., FIG. 8) include a current limiter transistor, which can be, for example, a thick oxide NFET or an array type transistor, used in combination with the isolator and/or equalize transistors.

Turning now to FIG. 5, EQL 532 and ISO 582 transistors are inside an array isolated p-well 510 in accordance with an exemplary embodiment of the present invention. The cross-sectional view of FIG. 5 shows EQL 532 and ISO 582 transistors inside array isolated p-well 510 which can be biased to −0.5 volts. FIG. 5 includes WL/BL short 160 at the intersection of WL 540 and BL 530 between ISO 582 and EQL 532, with a leakage path to ground 570. In addition to the transistor current, a forward biased diode current from both EQL 532 and ISO 582 transistor diffusion contributes to the overall leakage current. Array isolated p-well 510 is created by placing a p-well inside n-well (NW) 515, resulting in triple well (TW) 520. TW 520 uses the reverse bias between NW 515 and p-substrate 505 to electrically isolate individual DRAM and logic circuit sections thereby minimizing mutual interference. In the exemplary embodiment of FIG. 5, ISO 582 and EQL 532 are connected via BL 530 and are located at opposite ends of and internal to TW 520. Ground 570 is external to TW 520. N-well contacts 560a and 560b are at opposite ends of NW 515, near ISO 582 and EQL 532, respectively, while p-well contact 550 is within array isolated p-well 510. This arrangement can prevent the diffusion diode from being forward biased. Additionally, when the gate voltage of EQL 532 and ISO 582 transistors are tied to $V_{WLL}$, the transistor leakage path can also be avoided.

Figure 6:
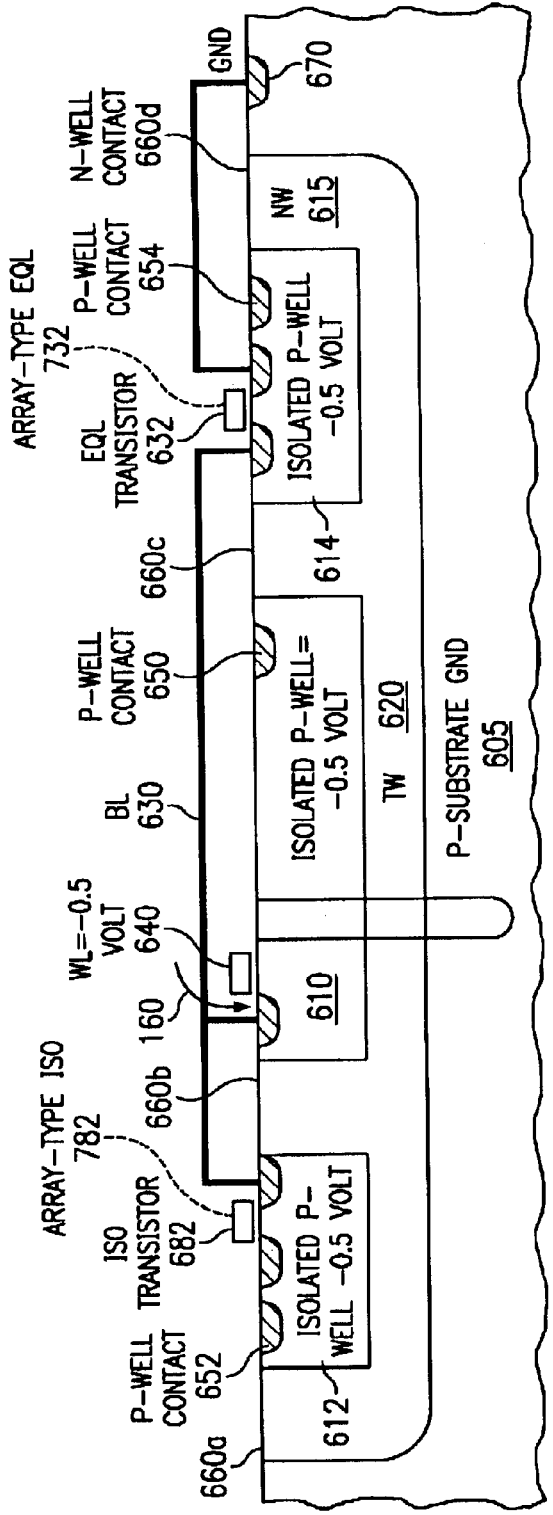
FIG. 6 diagrammatically illustrates an equalize and isolator transistor diffusion inside separate isolated p-wells in accordance with an exemplary embodiment of the present invention.

For concerns about noise injection into the array, EQL 532 (632 in FIG. 6) and ISO 582 (682 in FIG. 6) transistors can be placed in separate isolated p-wells 614 and 612, respectively, as illustrated cross-sectionally in FIG. 6. In the exemplary embodiment of FIG. 6, EQL 632 and ISO 682 transistors are inside isolated p-wells 614 and 612, respectively, each of which can be biased to −0.5 volts. Array isolated p-well 610 and isolated p-wells 612 and 614 are created by placing p-wells inside n-well (NW) 615, resulting in triple well (TW) 620 which uses the reverse bias between NW 615 and p-substrate 605 to electrically isolate individual DRAM and logic circuit sections thereby minimizing mutual interference. In the exemplary embodiment of FIG. 6, ISO 682 and EQL 632 are connected via BL 630 and are located at opposite ends of and internal to TW 620. EQL 632 is connected to ground 670, which is external to TW 620, opposite ISO 682. WL/BL short 160 is at the intersection of BL 630 and WL 640, between EQL 632 and ISO 682. N-well contacts 660a and 660d are at opposite ends of NW 615, near ISO 682 and EQL 632, respectively, while p-well contacts 650, 652 and 654 are within p-wells 610, 612 and 614, respectively. N-well contacts 660a and 660b are at opposite ends of isolated p-well 612. N-well contacts 660b and 660c are at opposite ends of array isolated p-well 610. N-well contacts 660c and 660d are at opposite ends of isolated p-well 614.

Figure 7:
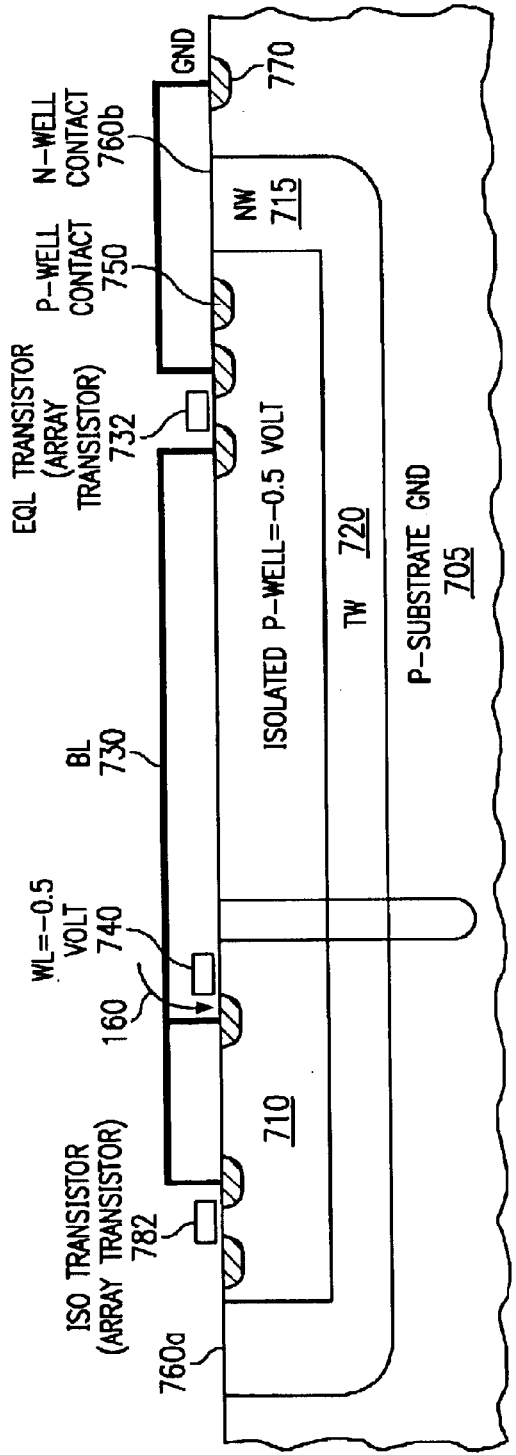
FIG. 7 diagrammatically illustrates use of an array transistor as an equalize and isolator transistor inside an isolated p-well in accordance with an exemplary embodiment of the present invention.

FIG. 7 diagrammatically illustrates use of array transistors as EQL 732 and ISO 782 transistors inside an isolated p-well 710 in accordance with an exemplary embodiment of the present invention. The exemplary embodiment of the present invention illustrated in the cross-sectional view of FIG. 7 shows array-type EQL 732 and ISO 782 transistors, both of which are placed inside array isolated p-well 710, which can be biased to −0.5 volts. Array isolated p-well 710 is created by placing a p-well inside n-well (NW) 715, resulting in triple well (TW) 720 which uses the reverse bias between NW 715 and p-substrate 705 to electrically isolate individual DRAM and logic circuit sections thereby minimizing mutual interference. ISO 782 and EQL 732 are connected via BL 730 and are located at opposite ends of and internal to TW 720. EQL 732 is connected to ground 770, which is external to TW 720, opposite ISO 782. WL/BL short 160 is at the intersection of BL 730 and WL 740, between EQL 732 and ISO 782. N-well contacts 760a and 760b are at opposite ends of NW 715, near ISO 782 and EQL 732, respectively, while p-well contact 750 is within array isolated p-well 710. This configuration is extremely compact. Again, for concerns about noise injection into the array, array-type EQL 732 and ISO 782 transistors can also be placed in separate isolated p-wells, as indicated by the dashed lines shown in FIG. 6.

FIG. 8 diagrammatically illustrates an array-type current limiter transistor 892 in an equalize path inside an array isolated p-well 810 in accordance with an exemplary embodiment of the present invention. Array isolated p-well 810 is created by placing a p-well inside n-well (NW) 815, thereby creating triple well (TW) 820. TW 820 uses the reverse bias between NW 815 and p-substrate 805 to electrically isolate individual DRAM and logic circuit sections thereby minimizing mutual interference. ISO 882 and EQL 832 are connected via BL 830 through current limiter (CL) transistor 892. EQL 832 is connected to ground 870 opposite current limiter transistor 892. ISO 882 and current limiter 892 are at opposite ends of and internal to TW 820. EQL 832 is external to TW 820. WL/BL short 160 is at the intersection of BL 830 and WL 840, between ISO 882 and current limiter transistor 892. N-well contacts 860a and 860b are at opposite ends of NW 815, near ISO 882 and EQL 832, respectively, while p-well contact 850 is within isolated p-well 810. N-well contact 860b is between current limiter 892 and EQL 832. The choice of array-type transistors for both ISO 882 and current limiter 892 transistors allows for a very compact layout. In stand-by mode, current limiter transistor 892 and ISO transistor 882 can be tied to $V_{WLL}$, preventing any WL/BL leakage path to ground, such as ground 870. In active mode, the non-activated banks can be operated in a mode like stand-by, preventing the non-activated banks from contributing to the overall leakage caused by WL/BL short 160.

Figure 2:
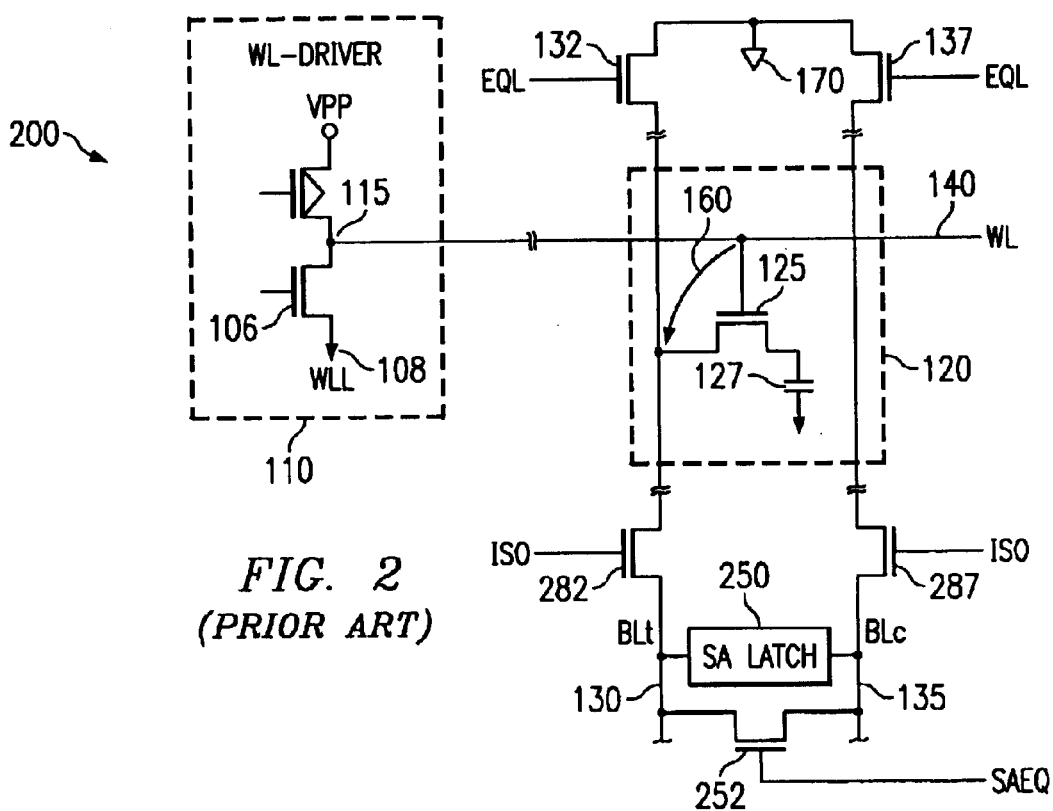
FIG. 2 diagrammatically illustrates a word line/bit line short in an array word line transistor with grounded equalize and shared sense amplifier as known in the art.
Figure 3:
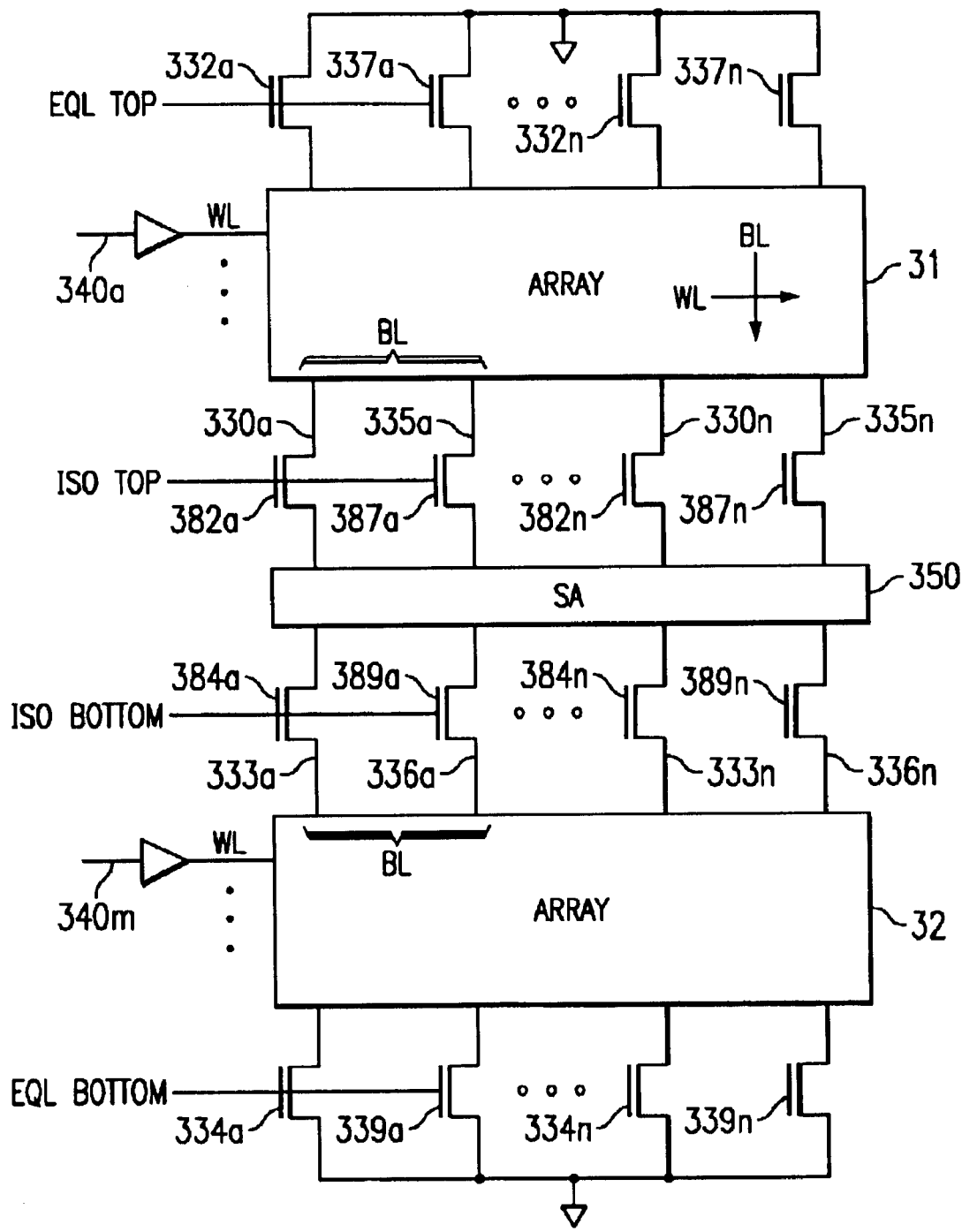
FIG. 3 diagrammatically illustrates a shared sense amplifier arrangement with equalize and isolator transistor as known in the art.
Figure 9:
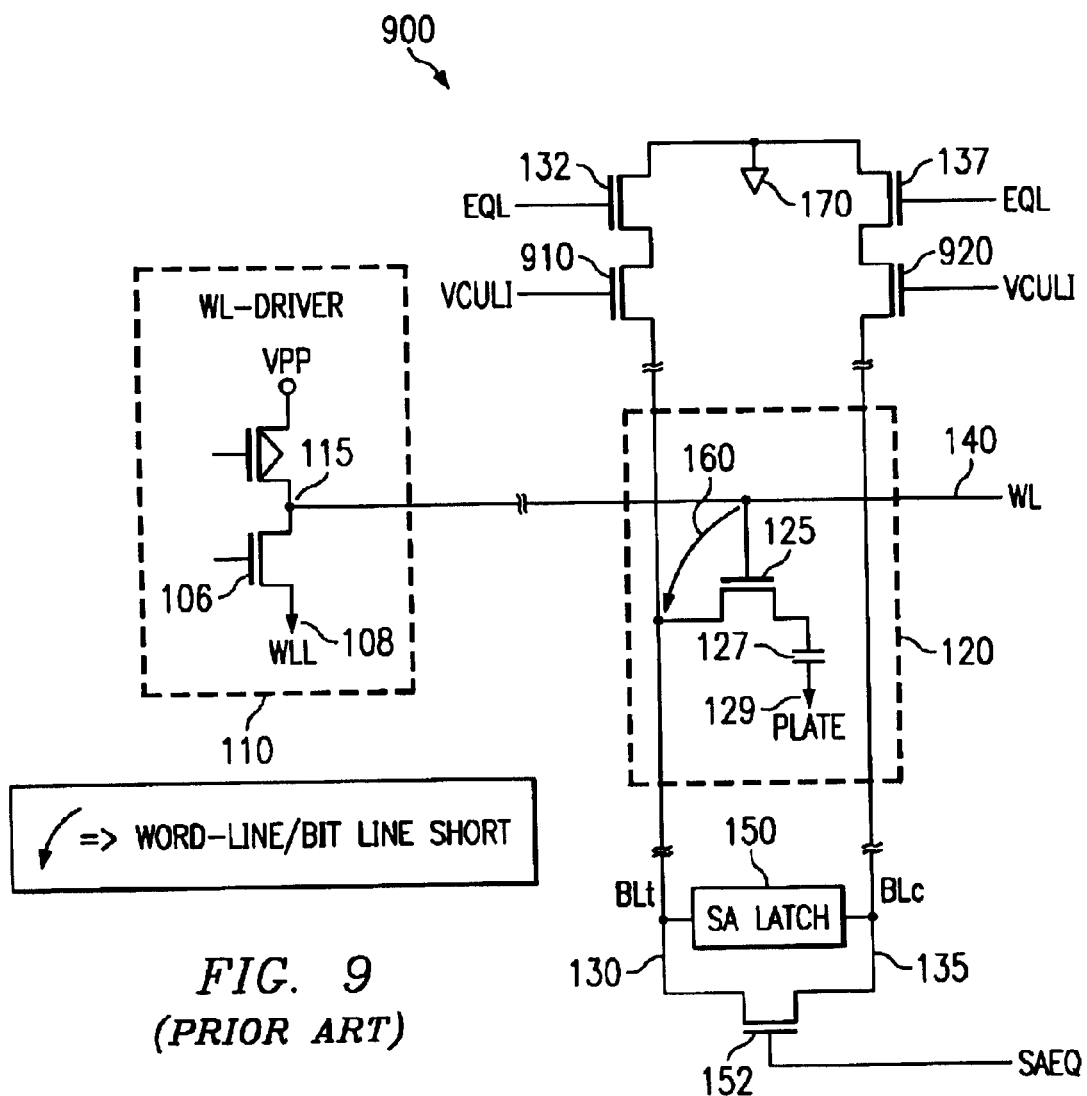
FIG. 9 diagrammatically illustrates a word line/bit line short with a current limiter transistor in an equalize path as known in the art.
Figure 10:
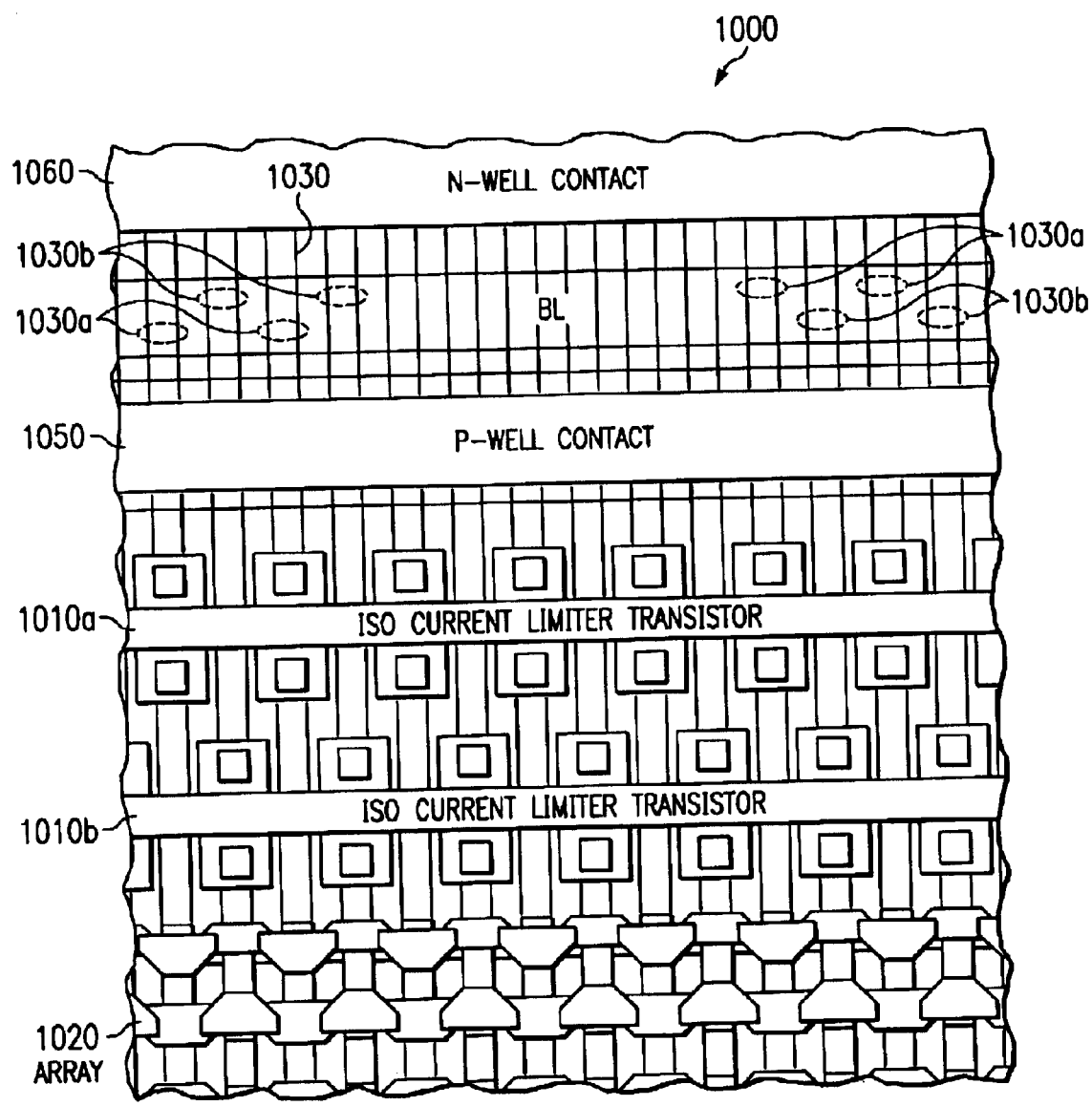
FIG. 10 diagrammatically illustrates an exemplary embodiment of a layout for an array transistor used as an isolator transistor as part of an array in accordance with the present invention.

FIG. 10 diagrammatically illustrates an exemplary embodiment of a layout 1000 for an array transistor used as an isolator transistor 1010 as part of an array in accordance with the present invention. WL array 1020 indicates the horizontally running WL and array cell which can be physically corresponded to WL 140 contacting array cell 120 of FIGS. 1, 2 and 9. BL(s) 1030 run perpendicular to WL array 1020, similar to BLt 130 and BLc 135 of FIGS. 1, 2 and 9. N-well contact 1060 can be physically associated with n-well contacts 560a, 660a, 760a and 860a in FIGS. 5–8. P-well contact 1050 can be physically associated with p-well contact 652. In the exemplary embodiment of FIG. 10, ISO transistors or current limiter transistors (ISO/Current 1010) can be staggered along BL pairs 1030a (see transistors 1010a) and 1030b (see transistors 1010b) in order to enable the placement of an ISO/Current 1010 on every BL pair 1030a and 1030b without exceeding any width constraints. The common gates of each ISO/Current 1010 are along the horizontally running WL(s) of WL array 1020. If the selected ISO/Current 1010 used in layout 1000 is a current limiter transistor, the gate length would be larger (than for an ISO) and/or the device width would be smaller (than for an ISO). An ISO/Current 1010 that is a current limiter transistor could be a thick oxide device, thereby allowing a reduction in driveability without increased area consumption.

Figure 11:
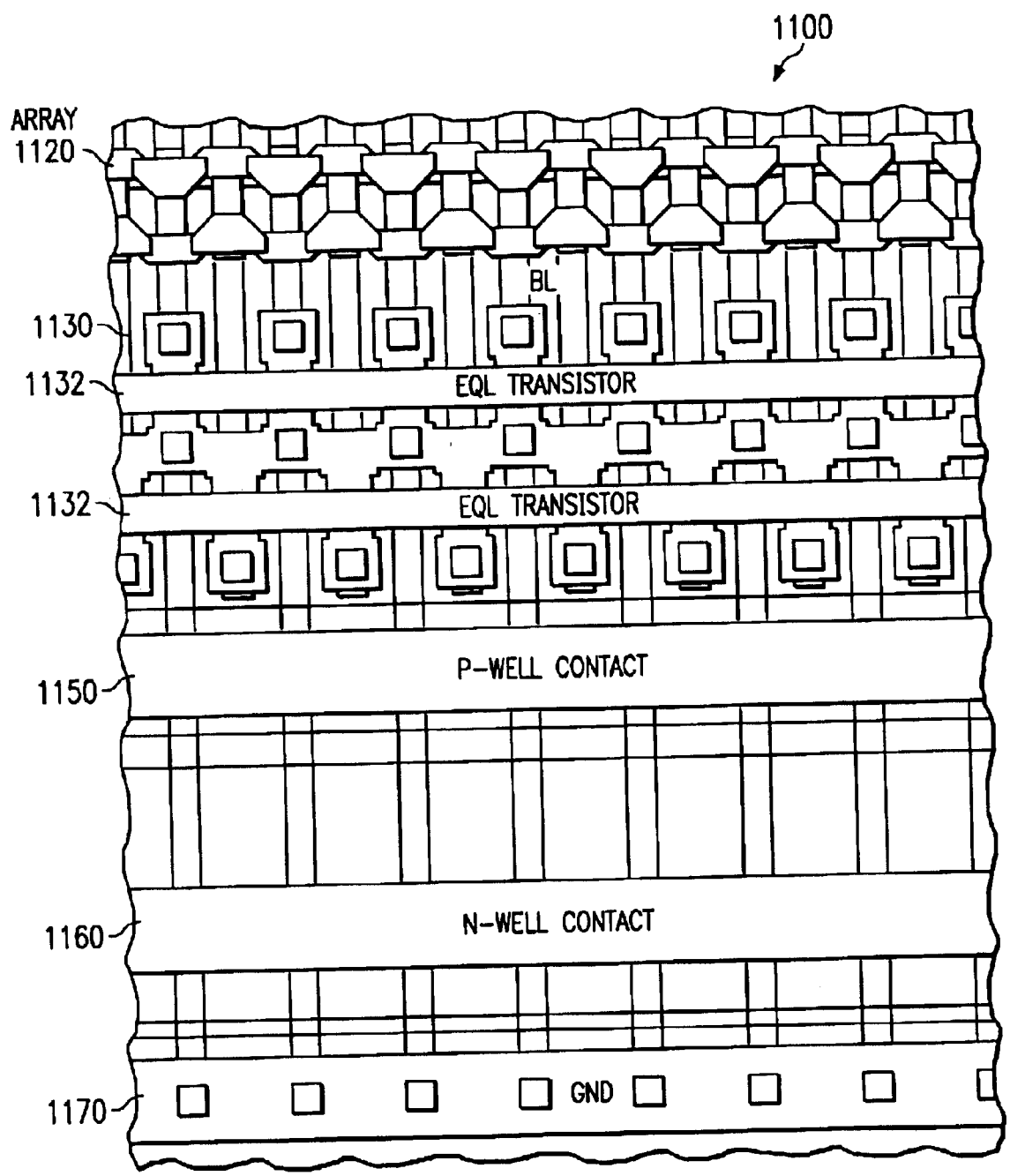
FIG. 11 diagrammatically illustrates an exemplary embodiment of a layout for an array transistor used as an equalize transistor as part of an array in accordance with the present invention.

FIG. 11 diagrammatically illustrates an exemplary embodiment of a layout 1100 for an array transistor used as an equalize transistor 1132 as part of an array in accordance with the present invention. WL array 1120 indicates the horizontally running WL and array cell which can be physically corresponded to WL 140 contacting array cell 120 of FIGS. 1, 2 and 9. BL(s) 1130 run perpendicular to WL array 1120, similar to BLt 130 and BLc 135 of FIGS. 1, 2 and 9. N-well contact 1160 can be physically associated with n-well contacts 560b, 660d, and 760b in FIGS. 5–7. P-well contact 1150 can be physically associated with p-well contacts 550, 654 and 750 in FIGS. 5–7. In the exemplary embodiment of FIG. 11, ground contact 1170 is outside the array p-well, similar to the placement of grounds 570, 670 and 770 in FIGS. 5–7. EQL 1132 is inside the array p-well, similar to the placement of EQLs 532, 632 and 732 in FIGS. 5–7. A side benefit of this embodiment is the additional space between BL(s) 1130 for contacting the p-well and n-well with ground wires.

FIG. 12 shows that exemplary embodiments of the invention can include any of the transistors ISO 1282, EQL 1232 and CL 1292 (and combinations thereof), at least one of which is disposed in one of the types of isolated p-wells described above. FIG. 13 illustrates in tabular format some possible exemplary transistor configurations comprehended by FIG. 12.

The exemplary embodiments of FIGS. 5 and 7 (which is similar to FIG. 5 with the inclusion of array type transistors 732 and 782) would correspond to configuration 4 of FIG. 13. The exemplary embodiment of FIG. 6 (including an embodiment using array type transistors 732 and 782 in separate p-wells) would correspond to configuration 8 of FIG. 13. The exemplary embodiment of FIG. 8 would correspond to configuration 22.

Although exemplary embodiments of the present invention have been described in detail, it will be understood by those skilled in the art that various modifications can be made therein without departing from the spirit and scope of the invention as set forth in the appended claims.

What is claimed is:

1. A DRAM apparatus, comprising:
   a storage cell; and
   a bit line structure coupled to said storage cell for accessing said storage cell, said bit line structure including an equalize transistor coupled between said storage cell and an equalize voltage, said equalize transistor located in an isolated p-well.

2. The DRAM apparatus of claim 1 wherein the isolated p-well is negative biased.

3. The DRAM apparatus of claim 2 wherein the isolated p-well is biased to approximately –0.5 volts.

4. The DRAM apparatus of claim 1 wherein the isolated p-well is one of an array p-well associated with said storage cell and a further p-well provided separately from said array p-well.

5. The DRAM apparatus of claim 1 wherein the equalize transistor is one of an NFET and an array-type transistor.

6. The DRAM apparatus of claim 5 wherein the isolated p-well is one of an array p-well associated with said storage cell and a further p-well provided separately from said array p-well.

7. The DRAM apparatus of claim 1 including a plurality of said storage cells and a plurality of said bit line structures respectively coupled to said storage cells.

8. A DRAM apparatus, comprising:
   a storage cell;
   a bit line structure coupled to said storage cell for accessing said storage cell, said bit line structure including an isolator transistor coupled to said storage cell and located in an isolated p-well; and
   a sense amplifier connected to the isolator transistor, the isolator transistor coupling the sense amplifier to said storage cell.

9. The DRAM apparatus of claim 8 wherein the isolated p-well is negative biased.

10. The DRAM apparatus of claim 9 wherein the isolated p-well is biased to approximately –0.5 volts.

11. The DRAM apparatus of claim 8 wherein the isolated p-well is one of an army p-well associated with said storage cell and a further p-well provided separately from said array p-well.

12. The DRAM apparatus of claim 8 wherein the isolator transistor is one of a thick oxide NFET and an array-type transistor.

13. The DRAM apparatus of claim 12 wherein the isolated p-well is one of an array p-well associated with said storage cell and a further p-well provided separately from said array p-well.

14. The DRAM apparatus of claim 8 including a plurality of said storage cells and a plurality of said bit line structures respectively coupled to said storage cells.

15. The DRAM apparatus of claim 8 wherein said bit line structure includes an equalize transistor coupled between said storage cell and an equalize voltage, and located in an isolated p-well.

16. The DRAM apparatus of claim 15 including a plurality of said storage cells and a plurality of said bit line structures respectively coupled to said storage cells.

17. The DRAM apparatus of claim 15 wherein said isolator transistor and said equalize transistor are located in a same isolated p-well.

18. The DRAM apparatus of claim 17 wherein said same isolated p-well is one of an array p-well associated with said storage cell and a further p-well provided separately from said array p-well.

19. The DRAM apparatus of claim 15 wherein the last-mentioned isolated p-well is one of an array p-well associated with said storage cell and a further p-well provided separately from said array p-well.

20. The DRAM apparatus of claim 19 wherein the first-mentioned isolated p-well is one of said array p-well and a further p-well provided separately from said array p-well.

21. The DRAM apparatus of claim 19 wherein the last-mentioned isolated p-well is negative biased.

22. The DRAM apparatus of claim 15 wherein said bit line structure includes a current limiter transistor in series with said isolator transistor and said equalize transistor, and located in an isolated p-well.

23. The DRAM apparatus of claim 22 wherein said current limiter transistor and said equalize transistor are located in a same isolated p-well.

24. The DRAM apparatus of claim 23 wherein said same isolated p-well is one of an array p-well associated with said storage cell and a further p-well provided separately from said array p-well.

25. The DRAM apparatus of clam 23 wherein said isolator transistor is located in said same isolated p-well.

26. The DRAM apparatus of claim 25 wherein said same isolated p-well is one of an array p-well associated with said storage cell and a further p-well provided separately from said array p-well.

27. The DRAM apparatus of claim 22 wherein each of said isolated p-wells is one of an array p-well associated with said storage cell and a further p-well provided separately from said array p-well.

28. The DRAM apparatus of claim 22 including a plurality of said storage cells and a plurality of said bit line structures respectively coupled to said storage cells.

29. The DRAM apparatus of claim 8 wherein said bit line structure includes a current limiter transistor in series with said isolator transistor and located in an isolated p-well.

30. The DRAM apparatus of claim 29 wherein said current limiter transistor and said isolator transistor are located in a same isolated p-well.

31. The DRAM apparatus of claim 30 wherein said same isolated p-well is one of an array p-well associated with said storage cell and a further p-well provided separately from said array p-well.

32. The DRAM apparatus of claim 29 wherein the last-mentioned isolated p-well is negative biased.

33. The DRAM apparatus of claim 29 wherein the last-mentioned isolated p-well is one of an array p-well associated with said storage veil and a further p-well provided separately from said array p-well.

34. The DRAM apparatus of claim 29 wherein the current limiter transistor is one of a thick oxide NFET and an array-type transistor.

35. The DRAM apparatus of claim 29 wherein the first-mentioned isolated p-well is one of an array p-well and a further p-well provided separately from said array p-well.

36. A DRAM apparatus, comprising:

a storage cell; and a bit line structure coupled to said storage cell for accessing said storage cell, said bit line structure including an equalize transistor coupled between said storage cell and an equalize voltage, and a current limiter transistor in series with said equalize transistor, said current limiter transistor located in an isolated p-well.

37. The DRAM apparatus of claim 36 wherein the isolated p-well is negative biased.

38. The DRAM apparatus of claim 37 wherein the isolated p-well is biased to approximately −0.5 volts.

39. The DRAM apparatus of claim 36 wherein the isolated p-well is one of an array p-well associated with said storage cell and a further p-well provided separately from said array p-well.

40. The DRAM apparatus of claim 36 wherein the current limiter transistor is one of a thick oxide NFET and an array-type transistor.

41. The DRAM apparatus of claim 40 wherein the isolated p-well is one of an array p-well associated with said storage cell and a further p-well provided separately from said array p-well.

42. The DRAM apparatus of claim 36 including a plurality of said storage cells and a plurality of said bit line structures respectively coupled to said storage cells.

43. The DRAM apparatus of claim 36 wherein said equalize transistor is located in an isolated p-well.

44. The DRAM apparatus of claim 43 wherein said equalize transistor and said current limiter transistor are located in a same isolated p-well.

45. The DRAM apparatus of claim 44 wherein said same isolated p-well is one of an array p-well associated with said storage cell and a further p-well provided separately from said array p-well.

46. The DRAM apparatus of claim 43 wherein each of said isolated p-wells is one of an array p-well associated with said storage cell and a further p-well provided separately from said array p-well.

47. The DRAM apparatus of claim 43 including a plurality of said storage cells and a plurality of said bit line structures respectively coupled to said storage cells.

48. A DRAM apparatus, comprising:

a storage cell; and a bit line structure coupled to said storage cell for accessing said storage cell, said bit line structure including an equalize transistor coupled between said storage cell and an equalize voltage, and a current limiter transistor in series with said equalize transistor, wherein said current limiter transistor is an array-type transistor.

* * * * *

UNITED STATES PATENT AND TRADEMARK OFFICE
CERTIFICATE OF CORRECTION

PATENT NO. : 6,930,930 B2
DATED : August 16, 2005
INVENTOR(S) : Terletzki et al.

It is certified that error appears in the above-identified patent and that said Letters Patent is hereby corrected as shown below:

Column 8,
Line 6, delete "army" insert -- array --.
Line 52, delete "clam" insert -- claim --.

Column 9,
Line 12, delete "veil" insert -- cell --.

Signed and Sealed this

Twenty-fourth Day of January, 2006

JON W. DUDAS
*Director of the United States Patent and Trademark Office*